(12) United States Patent
Wei et al.

(10) Patent No.: US 10,868,217 B2
(45) Date of Patent: Dec. 15, 2020

(54) LED CHIPS, METHOD OF MANUFACTURING THE SAME, AND DISPLAY PANELS

(71) Applicants: Kunshan New Flat Panel Display Technology Center Co., Ltd., Kunshan (CN); Kunshan Go-Visionox Opto-Electronics Co., Ltd., Kunshan (CN)

(72) Inventors: Dong Wei, Kunshan (CN); Rubo Xing, Kunshan (CN); Huimin Liu, Kunshan (CN); Xiaolong Yang, Kunshan (CN); Jiantai Wang, Kunshan (CN)

( * ) Notice: Subject to any disclaimer, the term of this patent is extended or adjusted under 35 U.S.C. 154(b) by 0 days.

(21) Appl. No.: 16/416,298

(22) Filed: May 20, 2019

(65) Prior Publication Data
US 2019/0273184 A1 Sep. 5, 2019

Related U.S. Application Data

(63) Continuation of application No. PCT/CN2018/089793, filed on Jun. 4, 2018.

(30) Foreign Application Priority Data

Mar. 7, 2018 (CN) .......................... 2018 1 0187158

(51) Int. Cl.
*H01L 33/38* (2010.01)
*H01L 33/62* (2010.01)
(Continued)

(52) U.S. Cl.
CPC ............... *H01L 33/38* (2013.01); *G09G 3/32* (2013.01); *H01L 24/28* (2013.01); *H01L 33/62* (2013.01)

(58) Field of Classification Search
CPC ......... H01L 33/38; H01L 33/62; H01L 24/28; H01L 33/387; H01L 33/0016; H01L 2933/0066; G09G 3/32
(Continued)

(56) References Cited

U.S. PATENT DOCUMENTS 7,456,438 B2 * 11/2008 Lee .......................... H01L 33/44
228/179.1
8,557,616 B2 * 10/2013 Lau ...................... H01L 27/1214
438/28
(Continued)

FOREIGN PATENT DOCUMENTS

| CN | 103247743 A | 8/2013 |
|---|---|---|
| CN | 104091874 A | 10/2014 |

(Continued)

OTHER PUBLICATIONS

TW Office Action dated Sep. 28, 2018 in the corresponding TW application (application No. 107209071).
(Continued)

*Primary Examiner* — Vu A Vu
(74) *Attorney, Agent, or Firm* — Kilpatrick Townsend & Stockton

(57) ABSTRACT

An LED chip provided by an embodiment includes a first semiconductor layer; an active layer and a second semiconductor layer located sequentially on the first semiconductor layer. A first contact electrode extends through the active layer and the second semiconductor layer and is electrically connected to the first semiconductor layer; a second contact electrode is located on the second semiconductor layer and is electrically connected to the second semiconductor layer; a first extension electrode is located on the first contact electrode and is electrically connected to the first contact electrode, the first extension electrode comprises a plurality of concave spots for soldering; and a second extension
(Continued)

electrode is located on the second contact electrode, electrically connected to the second contact electrode and isolated from the first extension electrode, and the second extension electrode includes a plurality of concave spots for soldering.

20 Claims, 13 Drawing Sheets

(51) Int. Cl.
  *H01L 23/00* (2006.01)
  *G09G 3/32* (2016.01)
(58) Field of Classification Search
  USPC .......................................................... 257/99
  See application file for complete search history.

(56) References Cited

U.S. PATENT DOCUMENTS

| | | | |
|---|---|---|---|
| 8,653,551 B2* | 2/2014 | Fujimori | H01L 33/405 |
| | | | 257/98 |
| 10,038,120 B2 | 7/2018 | Wang et al. | |
| 10,559,732 B2 | 2/2020 | Huang et al. | |
| 2013/0264603 A1 | 10/2013 | Lin et al. | |
| 2014/0034981 A1* | 2/2014 | Hung | H01L 33/46 |
| | | | 257/98 |
| 2017/0110629 A1* | 4/2017 | Suh | H01L 24/05 |
| 2018/0090639 A1 | 3/2018 | Ting et al. | |
| 2018/0108871 A1 | 4/2018 | Xu | |

FOREIGN PATENT DOCUMENTS

| | | |
|---|---|---|
| CN | 103367591 B | 2/2016 |
| CN | 105702823 A | 6/2016 |
| CN | 105870346 A | 8/2016 |
| CN | 107340656 A | 11/2017 |
| CN | 107546303 A | 1/2018 |
| EP | 2388836 A3 | 10/2013 |
| JP | 2013201156 A | 10/2013 |
| TW | 201505211 A | 2/2015 |
| TW | 201807840 A | 3/2018 |
| WO | 2014192226 A1 | 12/2014 |

OTHER PUBLICATIONS

CN First Office Action with search report dated Jan. 6, 2020 in the corresponding CN application(application No. 201810187158.2).

* cited by examiner

LED CHIPS, METHOD OF MANUFACTURING THE SAME, AND DISPLAY PANELS

CROSS-REFERENCES TO RELATED APPLICATIONS

The present application is a continuation application of International Application No. PCT/CN2018/089793, filed Jun. 4, 2018, which claims the priority to Chinese Application No. 201810187158.2 filed Mar. 7, 2018. The entireties of these applications are incorporated by reference herein for all purposes.

FIELD

Exemplary embodiments of the present disclosure relate to display technologies.

BACKGROUND

Micro light emitting diode display (micro-LED display) is a new generation of display technology that uses Micro LED units as sub-pixels to realize image display. Compared with liquid crystal display (LCD) technology, the Micro-LED display panel can realize image display without using an external light source, which improves the lightness and thinness of the display panel. In addition, compared with the Organic Light-Emitting Diode (OLED), which can also be a self-luminous display, the life of the Micro-LED display panel is long, which has become a hot spot in the industry.

Referring to FIG. 1, a cross-sectional view of an LED chip in the prior art is illustrated. The LED chip includes: a sapphire substrate 1; an N-type gallium nitride 2, a quantum well layer 3 and a P-type gallium nitride 4 sequentially arranged on the sapphire substrate; an indium tin oxide layer 5 located on the P-type gallium nitride 4; a first contact electrode 6 located on the indium tin oxide layer 5; and a second contact electrode 7 electrically connected to the N-type gallium nitride 2.

When the micro-LED is displaying, a voltage is applied to the first contact electrode 6 and the second contact electrode 7 to cause the quantum well layer 3 to emit light. Each LED chip is used as a sub-pixel unit to realize image display by controlling the luminous intensity of the quantum well layer 3 and combining the colorization technology.

SUMMARY

The problem to be solved by the present disclosure is to provide LED chips, methods of manufacturing the same, and display panels, which improve the yield of the display panel.

According to an aspect of the application, there is provided an LED chip including: a first semiconductor layer; an active layer and a second semiconductor layer located sequentially on the first semiconductor layer; a first contact electrode extending through the active layer and the second semiconductor layer and being electrically connected to the first semiconductor layer; a second contact electrode located on the second semiconductor layer and being electrically connected to the second semiconductor layer; a first extension electrode located on the first contact electrode and being electrically connected to the first contact electrode, the first extension electrode comprising a plurality of concave spots for soldering; and a second extension electrode located on the second contact electrode, being electrically connected to the second contact electrode and being isolated from the first extension electrode, and the second extension electrode including a plurality of concave spots for soldering In an exemplary embodiment, at least a portion of the first extension electrode or the second extension electrode is used to form the plurality of concave spots.

In an exemplary embodiment, each of the first extension electrode and the second extension electrode is a circular extension electrode, and an entire area of the circular extension electrode is used to form the plurality of concave spots.

In an exemplary embodiment, surfaces of the first contact electrode and the second contact electrode are flush with each other to constitute a forming surface; each of the first contact electrode and the second contact electrode is a circular contact electrode; and a projected area of the circular extension electrode on the forming surface is larger than a projected area of the circular contact electrode on the forming surface.

In an exemplary embodiment, a projection of the circular extension electrode on the forming surface and a projection of the circular contact electrode on the forming surface constitute a structure of concentric circles.

In an exemplary embodiment, a circular area in each of the first extension electrode and the second extension electrode is used to form the plurality of concave spots.

In an exemplary embodiment, the first contact electrode includes a primary contact electrode, and at least one auxiliary contact electrode is isolated from the primary contact electrode; the first extension electrode includes a primary extension electrode covering the primary contact electrode, an auxiliary extension electrode covering the auxiliary contact electrode, and a linear extension electrode connecting the primary extension electrode with the auxiliary extension electrode; and the plurality of concave spots are formed on a circular area of the primary extension electrode above the primary contact electrode.

In an exemplary embodiment, the second contact electrode includes a primary contact electrode, and at least one extension electrode is connected to the primary contact electrode; and the second extension electrode covers the primary contact electrode and the extension electrode, and a circular area of the second extension electrode above the primary contact electrode is used to form the plurality of concave spots.

In an exemplary embodiment, surfaces of the first contact electrode and the second contact electrode are flush with each other to constitute a forming surface; the primary contact electrode is a circular contact electrode; and a projected area of the circular area on the forming surface is greater than a projected area of the circular contact electrode on the forming surface.

In an exemplary embodiment, surfaces of the first contact electrode and the second contact electrode are flush with each other to constitute a forming surface; the primary contact electrode is a circular contact electrode; and a projected area of the circular area on the forming surface is greater than a projected area of the circular contact electrode on the forming surface.

In an exemplary embodiment a projection of the circular region on the forming surface and a projection of the circular contact electrode on the forming surface form a structure with concentric circles, intersecting circles, inscribed circles or inner *circulars*.

In an exemplary embodiment, a projection of the circular region on the forming surface and a projection of the circular contact electrode on the forming surface form a structure with concentric circles, intersecting circles, inscribed circles or inner *circulars*.

In an exemplary embodiment, the LED chip further includes: a first insulating layer located between the first contact electrode and the second contact electrode, and flush with surfaces of the first contact electrode and the second contact electrode.

In an exemplary embodiment, the LED chip further includes a second insulating layer located between the first extension electrode and the second extension electrode for realizing the isolation between the first extension electrode and the second extension electrode.

In an exemplary embodiment, a thickness of the second insulation layer is greater than a thickness of the first extension electrode or the second extension electrode.

In an exemplary embodiment, the concave spots includes circular spots, regular polygon spots or irregularly shaped concave spots.

In an exemplary embodiment, an opening size of the concave spot is in a range of 8 nm to 10 μm.

In an exemplary embodiment, spacing between two adjacent concave spots in the first extension electrode or the second extension electrode is in a range of 8 nm to 10 μm.

In an exemplary embodiment, a thickness of the first extension electrode or the second extension electrode is in a range of 20 nm to 2 μm.

In an exemplary embodiment, the first extension electrode or the second extension electrode is made of metal.

According to another aspect of the present disclosure, there is provided a method of manufacturing an LED chip, including: providing a substrate; forming a first semiconductor layer, an active layer, and a second semiconductor layer sequentially on the substrate; forming a first contact electrode extending through the active layer and the second semiconductor layer and electrically connected to the first semiconductor layer; forming a second contact electrode electrically connected to the second semiconductor layer on the second semiconductor layer; forming a first extension electrode electrically connected to the first contact electrode on the first contact electrode, the first extension electrode including a plurality of concave spots for soldering; and forming a second extension electrode electrically connected to the second contact electrode and isolated from the first extension electrode on the second contact electrode, the second extension electrode including a plurality of concave spots for soldering.

In an exemplary embodiment, the first extension electrode and the second extension electrode are formed by nanoimprint or photolithography.

In an exemplary embodiment, a first insulating layer is further formed between the first contact electrode and the second contact electrode, and is flush with surfaces of the first contact electrode and the second contact electrode to constitute a forming surface. The forming the first extension electrode and the second extension electrode includes: covering the forming surface with nanoimprint lithography resist; patterning the nanoimprint lithography resist by means of nanoimprint technology to form a nanoimprint pattern layer; forming a first conductive layer on the nanoimprint pattern layer and the forming surface among the nanoimprint pattern layer; removing the first conductive layer on the nanoimprint pattern layer, and remaining the first conductive layer on the forming surface, to constitute the first extension electrode and the second extension electrode; and removing the nanoimprint pattern layer.

In an exemplary embodiment, the forming the first conductive layer includes: forming the first conductive layer by an evaporation process.

In an exemplary embodiment, the first conductive layer is formed so that the thickness of the first conductive layer is less than the thickness of the nanoimprint pattern layer.

In an exemplary embodiment, the removing the first conductive layer on the nanoimprint pattern layer includes: removing the first conductive layer on the nanoimprint pattern layer by a lift-off process.

In an exemplary embodiment, the forming the first contact electrode and the second contact electrode includes: forming a first opening extending through the active layer and the second semiconductor layer and exposing the first semiconductor layer; covering a first insulating material layer on a bottom and a sidewall of the first opening, and the second semiconductor layer; patterning the first insulating material layer to expose the bottom of the first opening, and forming a second opening on the second semiconductor layer; filling the first opening and the second opening with a second conductive layer; and planarizing the second conductive layer and the first insulating material layer, the second conductive layer located in the first opening being used to constitute the first contact electrode, and the second conductive layer located in the second opening being used to constitute the second contact electrode.

In an exemplary embodiment, the method further includes: forming a second insulating layer between the first extension electrode and the second extension electrode.

In an exemplary embodiment, a thickness of the second insulating layer is greater than a thickness of the first extension electrode or the second extension electrode.

In an exemplary embodiment, the forming the second insulating layer includes: covering the first extended electrode, the second extended electrode, and the forming surface with a second insulating material layer; and patterning the second insulating material by a photolithography process to form the second insulating layer.

According to still another aspect of the present disclosure, there is also provided a display panel including: a driving backboard, including a substrate with a plurality of circuit units located thereon, the circuit units each including a first electrical terminal and a second electrical; and a plurality of LED chips inverted on the driving backboard. Each of the LED chips is the LED chip according to the above aspect, the first extension electrode of the LED chip is soldered to the first electricity through the concave spots, and the second extension electrode of the LED chip is soldered to the second electrical terminal through the concave spots.

In an exemplary embodiment, the substrate is a flexible substrate, a folded substrate or a stretched substrate.

Compared with the prior art, the technical solution of the present disclosure has the following advantages.

According to the present disclosure, a first extension electrode electrically connected to the first contact electrode is formed, a second extension electrode electrically connected to the second contact electrode is further formed, and both the first extension electrode and the second extension electrode include a plurality of concave spots for soldering. In this way, when the LED chip is soldered to the driving backboard, the concave spots for soldering can accommodate the solder, increasing the area of contact between the solder with the first extension electrode and second extension electrode. Therefore, the first extension electrode or the second extension electrode can have a strong soldering force with the driving backboard, so that it is not easy to fall off from the driving backboard which leads to a phenomenon of solder invalidation, thereby reducing the probability of occurrence of a dead pixel, and improving the yield of display panel.

DETAILED DESCRIPTION OF THE INVENTION

Figure 1:
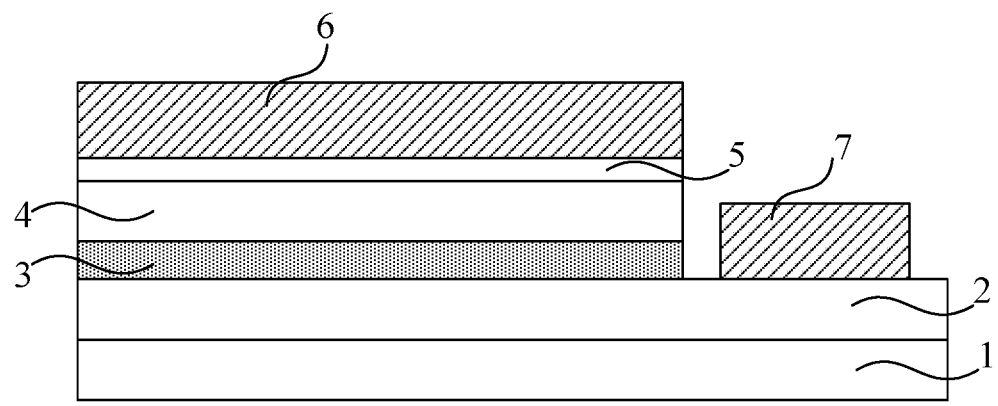
FIG. 1 is a cross-sectional diagram illustrating an LED chip in the prior art.

As the size of the LED chip electrode is reduced (as illustrated in FIG. 1 and described above), the number of dead pixels in the Micro-LED display panel is multiplied, thereby affecting the yield of the display panel.

It can be seen from the background that as the size of the LED chip electrode is reduced, the number of dead pixels in the Micro-LED display panel is multiplied, thereby affecting the yield of the Micro-LED display panel. The reason for the increase in the number of dead pixels in the Micro-LED display panel is analyzed in conjunction with FIG. 1:

In the manufacturing process of the actual Micro-LED, after the LED chip shown in FIG. 1 is manufactured, a sapphire substrate 1 of the LED chip is removed, and a plurality of LED chips are bonded on a driving backboard, thereby achieving batch transfer of LED chips.

Specifically, a first contact electrode 6 or a second contact electrode 7 is connected to the driving backboard by a soldering process during the process of bonding, so that the circuit unit on the driving backboard can apply a voltage to the first contact electrode 6 and the second contact electrode 7.

However, as the size of the LED chip is reduced, the size of the first contact electrode 6 and the second contact electrode 7 is reduced to a few micrometers or even a few nanometers. Since the contact area is small, the bonding force of the first contact electrode 6 or the second contact electrode 7 with the driving backboard is reduced, and the probability of a soldering invalidation of the LED chip is increased, thereby causing an increase in the number of dead pixels in the Micro-LED display panel.

In order to solve the above technical problem, the present disclosure provides a method of manufacturing an LED chip, by which a first extension electrode electrically connected to a first contact electrode is formed, a second extension electrode electrically connected to a second contact electrode is further formed, and both the first extension electrode and the second extension electrode include a plurality of concave spots for soldering. In this way, when the LED chip is soldered on the driving backboard, the concave spots for soldering can accommodate the solder, increasing the contact area of the solder with the first extension electrode and the second extension electrode. Therefore, the first extension electrode or the second extension electrode have a strong soldering force with the driving backboard, so that it is not easy to fall off from the driving backboard which leads to a phenomenon of soldering invalidation, thereby improving the yield of the display panel.

Referring to FIG. 2-FIG. 10, there are shown schematic diagrams illustrating respective steps of a method of manufacturing an LED chip according to an exemplary embodiment of the present disclosure. It should be noted that, in order to make the drawing concise and clear, one LED chip is taken as an example here. The method of manufacturing the LED chip includes the following processes.

Figure 2:
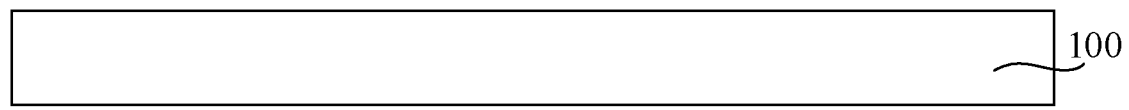
FIG. 2 to FIG. 10 are schematic diagrams illustrating respective steps of a method of manufacturing an LED chip according to an exemplary embodiment of the present disclosure.

As shown in FIG. 2, a substrate 100 is provided. The substrate 100 is used to provide a growth surface for a functional layer of an LED.

In this exemplary embodiment, the substrate 100 is a sapphire substrate and has a good lattice matching with a gallium nitride material. In other exemplary embodiments, the substrate may also be silicon carbide.

Figure 3:
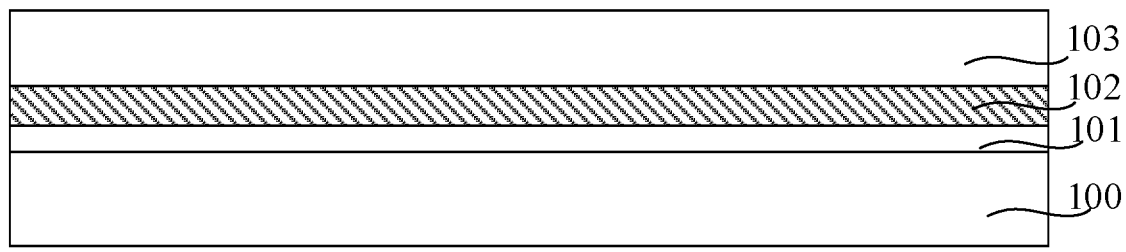

As shown in FIG. 3, a first semiconductor layer 101, an active layer 102, and a second semiconductor layer 102 are sequentially formed on the substrate 100. The first semiconductor layer 101, the active layer 102, and the second semiconductor layer 102 are used to form a core of a light emitting diode, as a functional layer of the LED chip.

In this exemplary embodiment, the first semiconductor layer 101 is made of N-type gallium nitride. The active layer 102 is a quantum well layer of an indium gallium nitride material. The second semiconductor layer 103 is made of P-type gallium nitride.

In the actual process, the first semiconductor layer 101, the active layer 102, and the second semiconductor layer 102 may be formed by a process of metal organic chemical vapor deposition (MOCVD).

Figure 4:
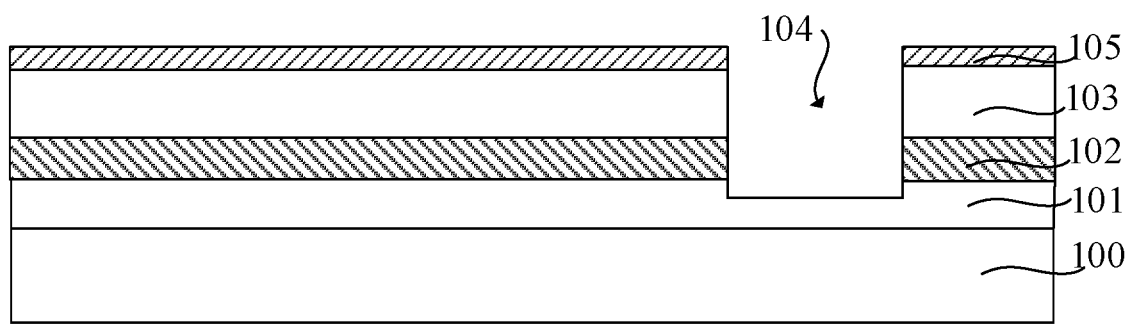
Figure 5:
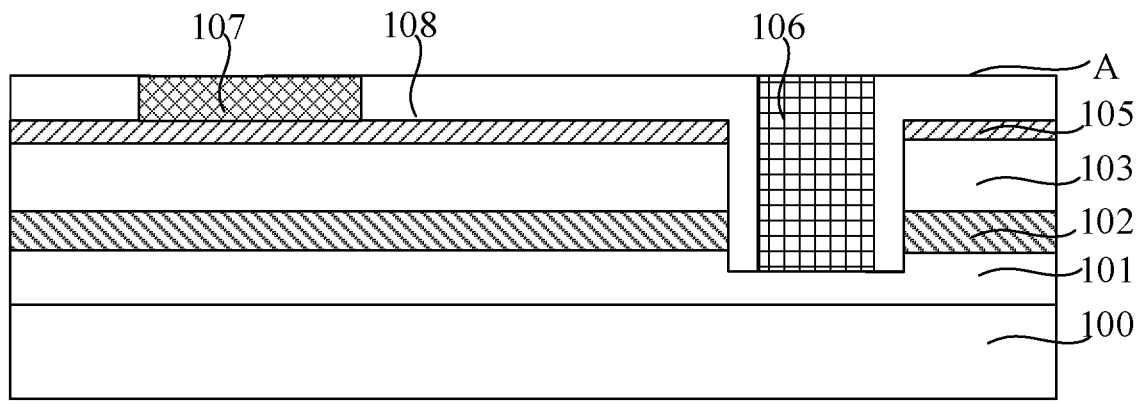

Referring to FIG. 4 and FIG. 5, a first contact electrode 106 extending through the active layer 102 and the second semiconductor layer 103 and electrically connected to the first semiconductor layer 101 is formed, and a second contact electrode 107 electrically connected to the second semiconductor layer 103 is formed on the second semiconductor layer 103.

The first contact electrode 106 and the second contact electrode 107 are used to apply a voltage to the first semiconductor layer 101 and the second semiconductor layer 103, respectively.

Specifically, the steps of forming the first contact electrode 106 and the second contact electrode 107 include the following processes.

As shown in FIG. 4, a first opening 104 extending through the active layer 102 and the second semiconductor layer 103 and exposing the first semiconductor layer 101 is formed.

Specifically, the first opening 104 is formed by patterning the active layer 102 and the second semiconductor layer 103 by a MESA photolithography.

It should be noted that, in this exemplary embodiment, a groove extending through the first semiconductor layer 101, the active layer 102, and the second semiconductor layer 103 and exposing the substrate 100 is formed by an isolation structure photolithography, to define an area for a single LED chip and isolate the LED chip from other LED chips.

With continued reference to FIG. 4, after forming the first opening 104, an ohmic contact layer 105 is further formed on the second semiconductor layer 103 in this exemplary embodiment, to reduce a contact resistance between the second contact electrode 107 and the second semiconductor layer 103 subsequently formed.

In this exemplary embodiment, the ohmic contact layer 105 is made of indium tin oxide.

Specifically, an indium tin oxide layer may be formed by a physical vapor deposition or sputtering process, and then the indium tin oxide layer on the bottom and sidewall of the first opening 104 is removed by photolithography, to form the ohmic contact layer 105 located in a surface of the second semiconductor layer 103.

As shown in FIG. 5, in this exemplary embodiment, after the ohmic contact layer 105 is formed, a first insulating layer 108 is formed for isolating the subsequently formed first contact electrode 106 and second contact electrode 107.

Specifically, a first insulating material layer is formed on the bottom and sidewall of the first opening 104, and on the second semiconductor layer 103. The first insulating material layer is patterned to expose the bottom of the first opening (as shown in FIG. 4) and form a second opening (not shown) on the second semiconductor layer 103, to form the first insulating layer 108. The first insulating layer 108 defines positions of the first contact electrode 106 and the second contact electrode 107 at the first opening 104 and the second opening, respectively.

It should be noted that, in this exemplary embodiment, the ohmic contact layer 105 is formed on the second semiconductor layer 103, and the first insulating material layer is in contact with the ohmic contact layer 105 on the second semiconductor layer 103 when the first insulating material layer is formed. The second opening exposes the ohmic contact layer 105 above the second semiconductor layer 103, when the second opening is formed.

The first insulating layer 108 is made of silicon oxide or silicon nitride. The first insulating material layer may be patterned by a photolithography process to form a first insulating layer 108.

With continued reference to FIG. 5, a first contact electrode 106 is formed in the first opening 104 (shown in FIG. 4), and a second contact electrode 107 is formed in the second opening (not shown).

Specifically, the first opening 104 and the second opening are filled with a second conductive layer, the second conductive layer and the first insulating material layer are planarized, and the second conductive layer located in the first opening 104 (as shown in FIG. 4) is used to constitute the first contact electrode 106. The second conductive layer located in the second opening is used to constitute the second contact electrode 107.

After the planarization process, the surfaces of the first contact electrode 106 and the second contact electrode 107 are flush with each other to constitute a forming surface A. The first insulating layer 108 is also flush with the surfaces of the first contact electrode 106 and the second contact electrode 107, providing a basis for subsequent formation of the first extension electrode and the second extension electrode.

Referring to FIGS. 6 to 10, a first extension electrode 111 electrically connected to the first contact electrode 106 is formed on the first contact electrode 106, and the first extension electrode 111 includes a plurality of concave spots 130 for soldering. A second extension electrode 121 electrically connected to the second contact electrode 107 and isolated from the first extension electrode 111 is formed on the second contact electrode 107, and the second extension electrode 121 includes a plurality of concave spots 130 for soldering.

The first extension electrode 111 is an extension electrode of the first contact electrode 106, and a plurality of concave spots 130 are formed in the first extension electrode 111 for placing solder and being soldered to the driving circuit, thereby implementing the electrical connection between the first contact electrode 106 and the driving circuit.

Correspondingly, the second extension electrode 121 is an extension electrode of the second contact electrode 107, and a plurality of concave spots 130 are formed in the second extension electrode 121 for placing solder and being soldered to the driving circuit, thereby implementing the electrical connection between the second contact electrode 107 and the driving circuit.

In this exemplary embodiment, the first extension electrode 111 and the second extension electrode 121 with the concave spots 130 are formed by a nanoimprint method. Specifically, the following processes are included.

Figure 6:
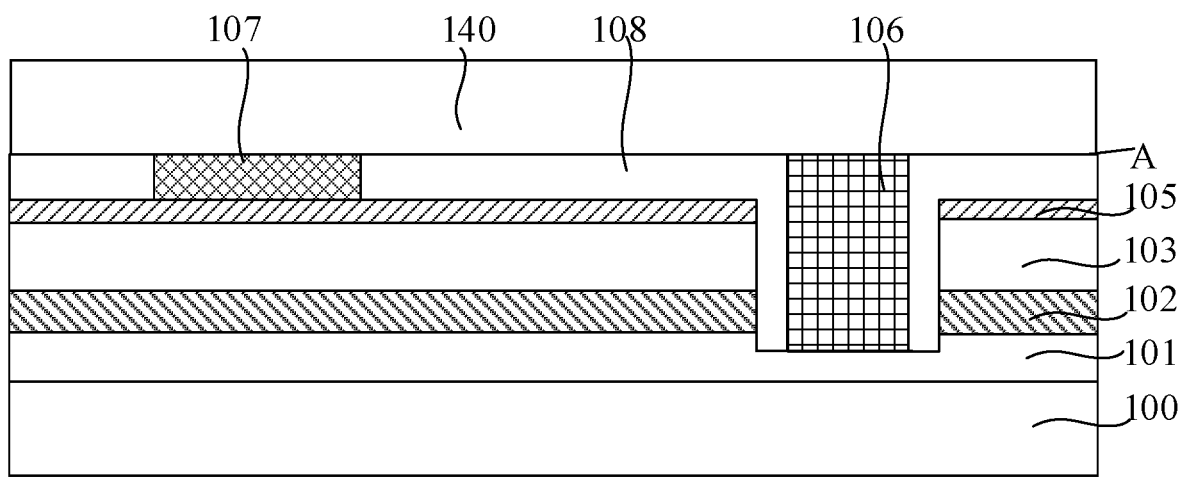

As shown in FIG. 6, the forming surface A is covered with nanoimprint lithography resist 140.

In this exemplary embodiment, the nanoimprint lithography resist 140 may be a polymer film, and the forming surface A may be covered by the nanoimprint lithography resist 140 by a coating method.

It should be noted that if the thickness of the nanoimprint lithography resist 140 is too small, the thicknesses of the subsequently formed first extension electrode and the second extension electrode are also too small (because the thickness of the first extension electrode and the second extension electrode are smaller than that of the nanoimprint lithography resist 140), so the depth of the concave spot is not depth enough, which does not favor the increase in soldering strength. If the thickness of the nanoimprint lithography resist 140 is too large, it is easy to cause waste of materials and increase the difficulty of the nanoimprint process. Accordingly, in this exemplary embodiment, the nanoimprint lithography resist 140 has a thickness in a range of 1 μm to 10 μm.

Figure 7:
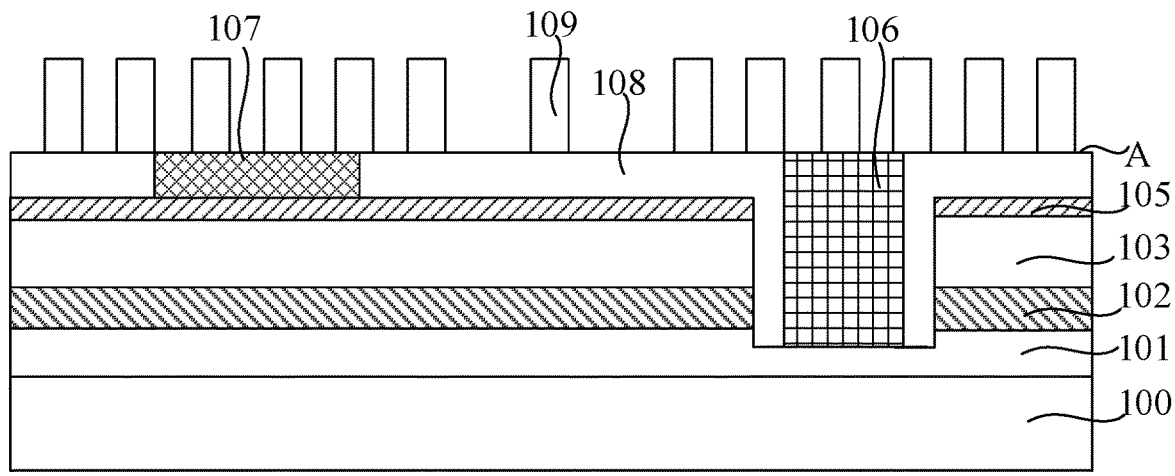

As shown in FIG. 7, the nanoimprint lithography resist 140 (shown in FIG. 6) is patterned by nanoimprint lithography to form a nanoimprint pattern layer 109.

The nanoimprint pattern layer 109 serves as a mask for the subsequently formed first extension electrode and second extension electrode for defining the positions and patterns of the first extension electrode and the second extension electrode.

Specifically, a nanoimprint mould is provided, and the nanoimprint lithography resist 140 is imprinted by the mould, so that the pattern of the mould is transferred into the nanoimprint lithography resist 140, thereby patterning the nanoimprint lithography resist 140 to form a nanoimprint pattern layer 109.

It should be noted that, in this exemplary embodiment, the first extension electrode and the second extension electrode are formed by two pattern transfers, and correspondingly, the pattern of the mould is consistent with the patterns of the first extension electrode and the second extension electrode to be formed. For example, the position and pattern of the concave portion (or convex portion) pattern in the mould coincide with the position and pattern in which the concave portion (or convex portion) is formed in the first extension electrode and the second extension electrode.

Figure 8:
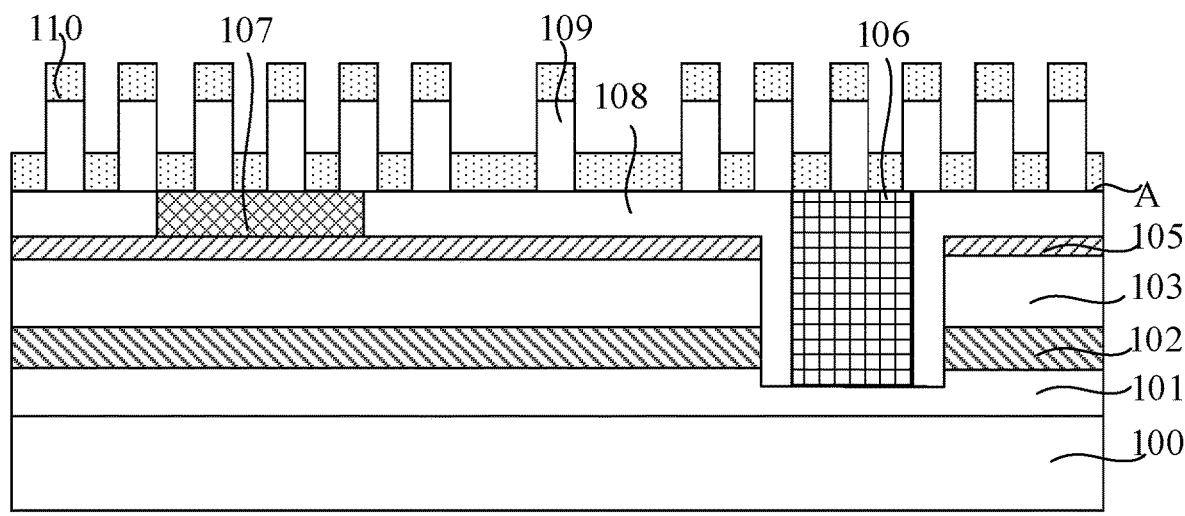

As shown in FIG. 8, a first conductive layer 110 is formed on the forming surface A between the nanoimprint pattern layer 109 and the nanoimprint pattern layer 109.

The portion of the first conductive layer 110 located on the surface A is used to form the first extension electrode and the second extension electrode.

In this exemplary embodiment, the first conductive layer 110 is made of metal, such as gold, silver or aluminum. The metal may be reflective, thereby improving the light extraction efficiency of the LED chip.

In an actual process, the first conductive layer 110 may be formed by an evaporation method. In other exemplary embodiments, the first conductive layer 110 may also be formed by a sputtering or electroplating process.

In this exemplary embodiment, the thickness of the first conductive layer 110 is smaller than the thickness of the nanoimprint pattern layer 109, so that a top surface of the first conductive layer 110 on the forming surface A is lower than a top surface of the nanoimprint layer 109 such that the first conductive layer 110 on the forming surface A is isolated from the first conductive layer 110 on the top surface of the nanoimprint pattern layer 109 to facilitate to remove the first conductive layer 110 on the top surface of the nanoimprint pattern layer 109 by removal of the nanoimprint pattern in a subsequent process, and retain the first conductive layer 110 on the forming surface A.

It should be noted that if the thickness of the first conductive layer 110 is too small, the thicknesses of the first extension electrode and the second extension electrode are also small, and correspondingly, the depths of concave spots in the first extension electrode and the second extension electrode are small, which does not favor the increase in soldering strength. If the thickness of the first conductive layer 110 is too large, the thicknesses of the first extension electrode and the second extension electrode are also too large, and the resistance between the first contact electrode 106 and the second contact electrode 107 and the driving circuit is easily increased. It is easy to cause the aspect ratio of the concave spot to be too large and increase the filling difficulty of the solder. Correspondingly, the thickness of the first conductive layer 110 is in a range of 20 nm to 2 μm.

Figure 9:
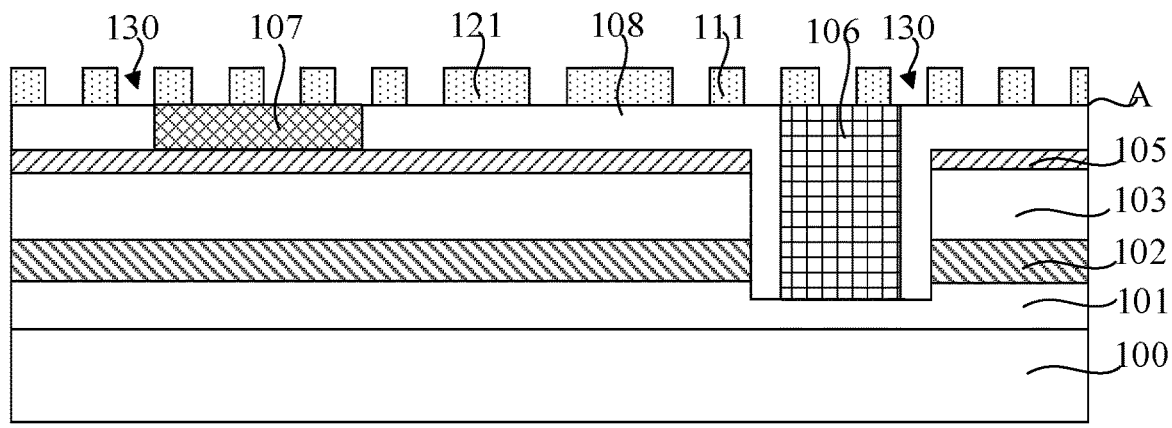
Figure 10:
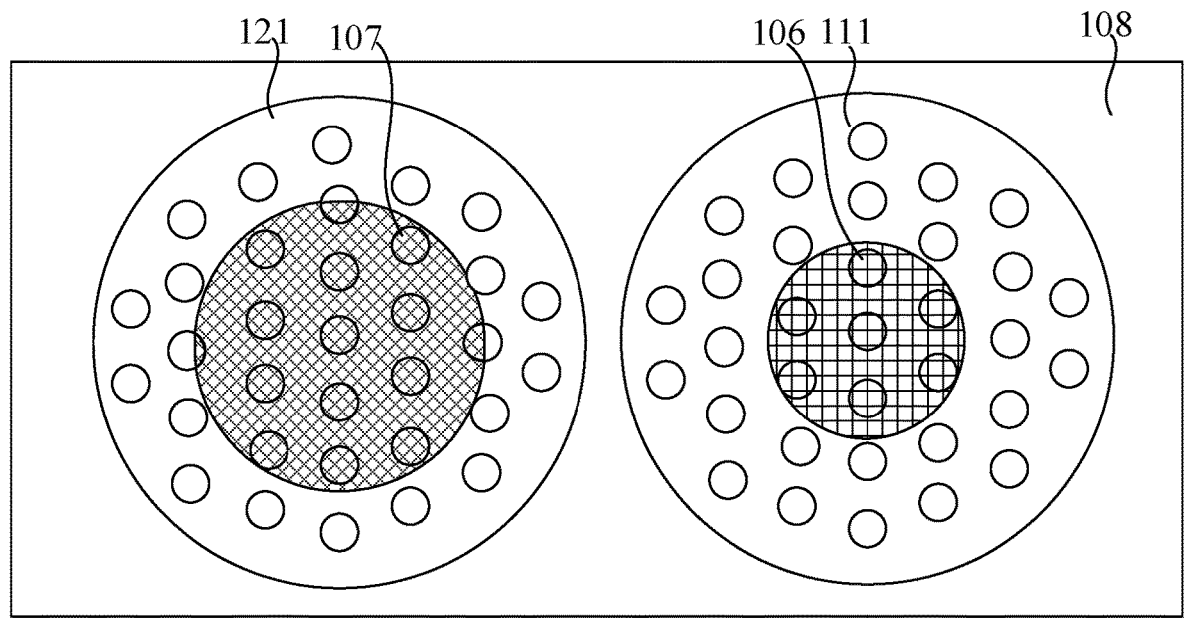

As shown in FIGS. 9 and 10, the first conductive layer 110 on the nanoimprint pattern layer 109 (shown in FIG. 8) is removed, and the first conductive layer 110 on the forming surface A is retained to constitute the first extension electrode 111 and the second extension electrode 121.

After the nanoimprint pattern layer 109 is removed, a portion of the space occupied by the nanoimprint pattern layer 109 is used to form the concave spots 130.

In this exemplary embodiment, the first conductive layer 110 on the nanoimprint pattern layer 109 is removed by a lift off process. Specifically, the first conductive layer 110 on the nanoimprint pattern layer 109 may be lifted off by a tape.

After removing the first conductive layer 110 on the nanoimprint pattern layer 109, the nanoimprint pattern layer 109 is removed.

Specifically, after the first conductive layer 110 on the nanoimprint pattern layer 109 is lifted off, the nanoimprint pattern layer 109 is removed by an etching process. The etching process may be a dry or wet etching process.

Referring to FIG. 10, which is a top view of the LED chip shown in FIG. 9, in this exemplary embodiment, each of the first extension electrode 111 and the second extension electrode 121 is a circular extension electrode, and an entire area of the circular extension electrode is used to form a plurality of concave spots 130. In the subsequent soldering process, the solder is likely to form a circular extension surface. With the method of manufacturing the LED chip in this exemplary embodiment, a circular extension electrode with a plurality of concave spots 130 is formed, which matches the shape of the circular extension surface. A larger soldering area can be obtained by a smaller extension electrode area, thereby improving the utilization ratio of the first extension electrode 111 and the second extension electrode 121.

Further, each of the plurality of concave spots 130 shown in FIG. 10 has a circular shape. The process of the circular concave spot 130 is relatively simple, and the manufacturing efficiency of the LED chip is improved.

It should be noted that, in other exemplary embodiments, the first extension electrode and the second extension electrode of other shapes may also be formed, and the plurality of concave spots may be formed on all or a part of the first extension electrode and the second extension electrode. The concave spot may also be in the shape of a triangle, a square, or the like. In a practical application, the first extension electrode and the second extension electrode are formed by providing different moulds.

It should be noted that, in this exemplary embodiment, the first extension electrode and the second extension electrode are formed by a nanoimprint lithography process. In other exemplary embodiments, the first extension electrode and the second extension electrode may also be formed by a photolithography process.

Figure 11:
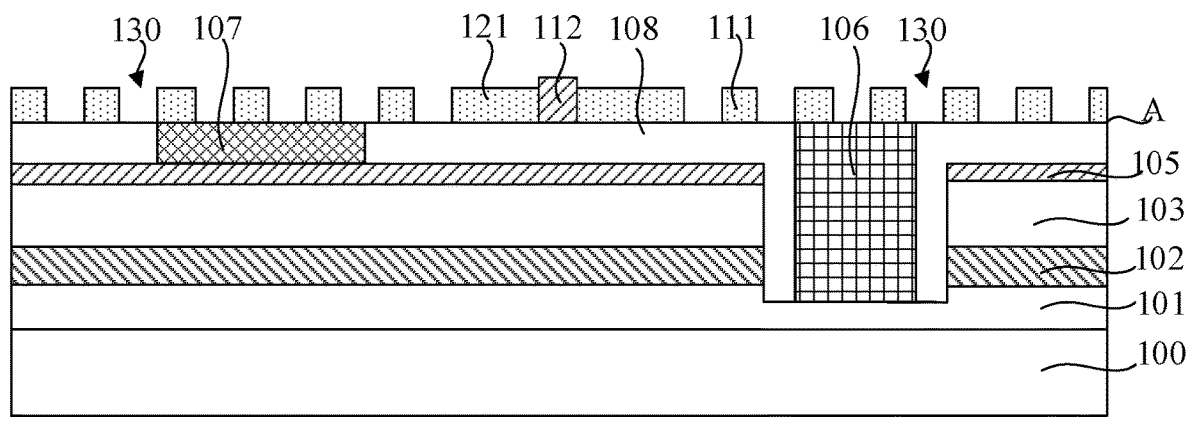
FIG. 11 is a cross-sectional diagram illustrating an LED chip according to an exemplary embodiment of the present disclosure.
Figure 12:
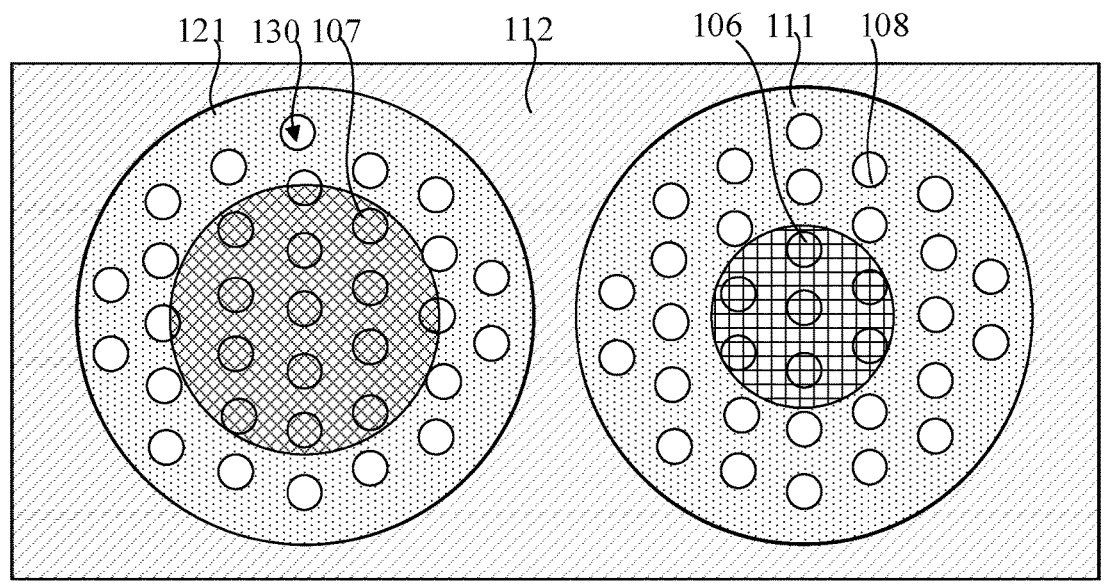
FIG. 12 is a top view illustrating the LED chip shown in FIG. 11.

It should be noted that, as shown in FIG. 11 and FIG. 12, in other exemplary embodiments, the second insulating layer 112 may be formed between the first extension electrode 111 and the second extension electrode 121. The second insulating layer 112 is used to achieve isolation between the first extension electrode 111 and the second extension electrode 121.

A second insulating material layer is formed on the first extension electrode 111 and the second extension electrode 121, and the forming surface A between the first extension electrode 111 and the second extension electrode 121, and the second insulation material layer is patterned to form the second insulating layer 112.

The second insulating layer 112 is made of silicon nitride, silicon oxide or the like. The second insulating material layer may be patterned by a photolithography process to form the second insulating layer 112.

In this exemplary embodiment, the thickness of the second insulating layer 112 is greater than the thickness of the first extension electrode 111 or the second extension electrode 121. In this way, in addition to the electrical isolation of the first extension electrode 111 and the second extension electrode 121, the second insulating layer 112 can also physically isolate the solder on the different extension electrodes during the soldering process, thereby achieving electrical isolation. Specifically, the thickness of the second insulating layer 112 is in a range of 1 μm to 10 μm.

It should be noted that with the method of manufacturing the LED chip according to the present disclosure, the second insulating layer may not be formed, and when the LED chip is soldered to the driving circuit, precise soldering process control can prevent solders respectively located on the first extension electrode and the second extension electrode from being connected together, thereby avoiding a short circuit between the first extension electrode and the second extension electrode.

In order to manufacture the display panel, after the LED chip has been manufactured, it is necessary to remove the substrate 100 in the LED chip, and solder the LED chip to the driving backboard to realize batch transfer. The driving backboard includes a plurality of circuit units, and the first extension electrode 111 of the LED chip is connected to the first electrical terminal of the circuit unit, and the second extension electrode 121 of the LED chip is connected to the second electrical terminal. A voltage is applied to the first contact electrode 106 and the second contact electrode 107 of the LED chip through the circuit unit, thereby causing the active layer 102 in the LED chip to emit light.

Specifically, the first extension electrode 111 is soldered to the first electrical terminal of the driving backboard, and the second extension electrode 121 is soldered to the second electrical terminal of the driving backboard. The concave spots 130 in the first extension electrode 111 and the second extension electrode 121 are used for soldering, and the solder located in the concave spots 130 can increase the area of contact between the solder with the first extension electrode 111 and the second extension electrode 121, thereby improving the soldering strength and preventing the LED chip from falling off the driving backboard, in turn, reducing the probability of the generation of dead pixels, and increasing the yield.

In order to solve the technical problem, the present disclosure further provides an LED chip including a first extension electrode electrically connected to the first contact electrode, and a second extension electrode electrically connected to the second contact electrode. Each of the first extension electrode and the second extension electrode includes a plurality of concave spots for soldering. Thus, when the LED chip is soldered on the driving backboard, the concave spots for soldering can accommodate the solder, increasing the area of contact of the solder with the first extension electrode and the second extension electrode. The first extension electrode or second extension electrode may have strong soldering force with the driving backboard, so that it is not easy to fall off from the driving backboard which leads to a phenomenon of solder invalidation, thereby improving the yield of the display panel.

With continued reference to FIG. 11 and FIG. 12, there are shown cross-sectional and top views, respectively, of an LED chip according to an exemplary embodiment of the present disclosure. In this exemplary embodiment, the LED chip includes:

a first semiconductor layer 101, an active layer 102 and a second semiconductor layer 103 sequentially located on the first semiconductor layer 101. The first semiconductor layer 101, the active layer 102, and the second semiconductor layer 102 are used to constitute a core of a light emitting diode, which is a functional layer of the LED chip. In this exemplary embodiment, the first semiconductor layer 101 is located on the substrate 100.

Specifically, the first semiconductor layer 101 is made of N-type gallium nitride. The active layer 102 is a quantum well layer of an indium gallium nitride material. The second semiconductor layer 103 is made of P-type nitride. gallium.

A first contact electrode 106 extends through the active layer 102 and the second semiconductor layer 103 and is electrically connected to the first semiconductor layer 101. A second contact electrode 107 is located on the second semiconductor layer 103 and is electrically connected to the second semiconductor layer 103. The first contact electrode 106 and the second contact electrode 107 are respectively used to apply a voltage to the first semiconductor layer 101 and the second semiconductor layer 103.

In this exemplary embodiment, the surfaces of the first contact electrode 106 and the second contact electrode 107 are flush with each other to constitute the forming surface A.

A first insulating layer 108 is further formed between the first contact electrode 106 and the active layer 102 and the second semiconductor layer 103 for electrically isolating the first contact electrode 106 from the active layer 102 and the second semiconductor layer 103.

It should be noted that the first insulating layer 108 is also located above the second semiconductor layer 103 and between the first contact electrode 106 and the second contact electrode 107. The first insulating layer 108 is flush with the surfaces of the first contact electrode 106 and the second contact electrode 107.

In this exemplary embodiment, the first insulating layer 108 is made of silicon oxide or silicon nitride.

An ohmic contact layer 105 is further formed between the second semiconductor layer 103 and the second contact electrode 107 for reducing the contact resistance between the second contact electrode 107 and the second semiconductor layer 103. In this exemplary embodiment, the ohmic contact layer 105 is made of indium tin oxide.

The LED chip further includes: a first extension electrode 111 located on the first contact electrode 106 and electrically connected to the first contact electrode 106, and including a plurality of concave spots for soldering; and a second extension electrode 121 located on the second contact electrode 107, electrically connected to the second contact electrode 107, isolated from the first extension electrode 111, and including a plurality of concave spots 130 for soldering.

As shown in FIG. 12, in this exemplary embodiment, each of the first extension electrode 111 and the second extension electrode 121 is a circular extension electrode, and an entire area of the circular extension electrode is used to form the plurality of concave spots 130. In the subsequent soldering process, the solder is likely to form a circular extension surface. The circular extension electrode with a plurality of concave points 130 in the LED chip of the exemplary embodiment matches the shape of the circular extension surface. A larger soldering area can be obtained by a smaller extension electrode area, thereby improving the utilization ratio of the first extension electrode 111 and the second extension electrode 121.

In other exemplary embodiments, each of the first extension electrode and the second extension electrode may further have other shapes, for example, may be an elliptical extension electrode, a racetrack-shaped extension electrode, a polygonal extension electrode, etc., and the plurality of concave spots are formed in the entire area of the extension electrode.

In this exemplary embodiment, the first contact electrode 106 and the second contact electrode 107 are circular contact electrodes. A projected area of the circular extension electrode on the forming surface A is larger than a projected area of the circular contact electrode on the forming surface A. That is, the projected areas of the first extension electrode 111 and the second extension electrode 121 on the forming surface A are large, so that the soldering areas of the first extension electrode 111 and the second extension electrode 121 can be increased.

In particular, for the first contact electrode 106, the first contact electrode 106 extends through the active layer 102 and the second semiconductor layer 103. Accordingly, the first contact electrode 106 is generally an electrode having a small cross section, which can reduce the influence of the first contact electrode 106 on the LED illumination area. In this exemplary embodiment, by providing the first extension electrode 111 electrically connected to the first contact electrode 106, the increase in the area of the first extension electrode 111 does not affect the LED illumination area. Therefore, by increasing the area of the first extension electrode 111, the soldering area of the first extension electrode 111 and the driving circuit can be increased, thereby improving the soldering strength of the first contact electrode 106 and the driving circuit.

It should be noted that, in other exemplary embodiments, the projected areas of the first extension electrode and the second extension electrode may be equal to or slightly smaller than the projected areas of the first contact electrode and the second contact electrode. Because a plurality of concave spots are formed in the first extension electrode and the second extension electrode, the sidewalls of the plurality of concave spots can still function to increase the soldering area, thereby increasing the soldering strength.

Referring to FIGS. 11 and 12, the projection of the circular extension electrode and the circular contact electrode on the forming surface A constitutes a structure of concentric circles. Thus, when the LED chip is soldered to the driving circuit, the solder is located at the center of the concentric circles, which ensures a large area of contact between the driving circuit and the circular extension electrode, and between the circular extension electrode and the circular contact electrode, thereby increasing the soldering strength.

It should be noted that, in other exemplary embodiments, the first extension electrode is electrically connected to the first contact electrode, and the second extension electrode is electrically connected to the second contact electrode. The projection of the circular extension electrode and the circular contact electrode on the forming surface A may also be in a structure with intersecting circles, inscribed circles or an inner circular.

In this exemplary embodiment, the first extension electrode 111 and the second extension electrode 121 are made of metal, such as gold, silver or aluminum. The metal can be reflective, thereby improving the light extraction efficiency of the LED chip. In other exemplary embodiments, the first extension electrode and the second extension electrode may also be made of other conductive materials.

If the thicknesses of the first extension electrode 111 and the second extension electrode 121 are too small, correspondingly, the depths of the concave spots 130 in the first extension electrode 111 and the second extension electrode 121 are small, which easily affects the effect of force enhancement. If the thicknesses of the first extension electrode 111 and the second extension electrode 121 are too large, the resistance between the first contact electrode 106, the second contact electrode 107 and the driving circuit is easily increased, and the aspect ratio of the concave spot 130 is also likely to be excessively large to increase the filling difficulty of the solder. Accordingly, the thickness of each of the first extension electrode 111 and the second extension electrode 121 is in a range of 20 nm to 2 µm.

As shown in FIG. 12, the concave spots 130 located in the first extension electrode 111 and the second extension electrode 121 are circular, and the process of forming the circular concave spots is relatively simple.

It should be noted that if the size of the opening of the concave spot 130 is too large (or the spacing between adjacent concave spots 130 is too small), it is easy to affect the contact area between the first extension electrode 111 and the first contact electrode 106 or between the second extension electrode 121 and the second contact electrode 107, thereby affecting the electrical connection effect. If the opening size of the concave spots 130 is too small (or the spacing between adjacent concave spots 130 is too large), it is not conducive to the increase in the soldering area, and further influencing the soldering effect. Correspondingly, the opening size of the concave spot 130 is in a range of 8 nm to 10 µm, and the spacing between adjacent concave spots in the first extension electrode 111 or the second extension electrode 121 is in a range of 8 nm to 10 µm.

With continued reference to FIG. 11 and FIG. 12, in this exemplary embodiment, the LED chip further includes: a second insulating layer 112 between the first extension electrode 111 and the second extension electrode 121, for isolating the first extension electrode 111 from the second extension electrode 121.

In this exemplary embodiment, the thickness of the second insulating layer 112 is greater than the thickness of the first extension electrode 111 or the second extension electrode 121. In this way, in addition to the electrical isolation of the first extension electrode 111 and the second extension electrode 121, the second insulating layer 112 can physically isolate the solder on the different extension electrodes during the soldering process, thereby achieving electrical isolation. Specifically, the thickness of the second insulating layer 112 is in a range of 1 µm to 10 µm.

The second insulating layer 112 is made of silicon nitride, silicon oxide or the like.

It should be noted that, in other exemplary embodiments, the second insulating layer may not be disposed, and when the LED chip is soldered to the driving circuit, the solders respectively located on the first extension electrode and the second extension electrode are not connected together by precise soldering process control, thereby avoiding a short circuit between the first extension electrode and the second extension electrode.

Figure 13:
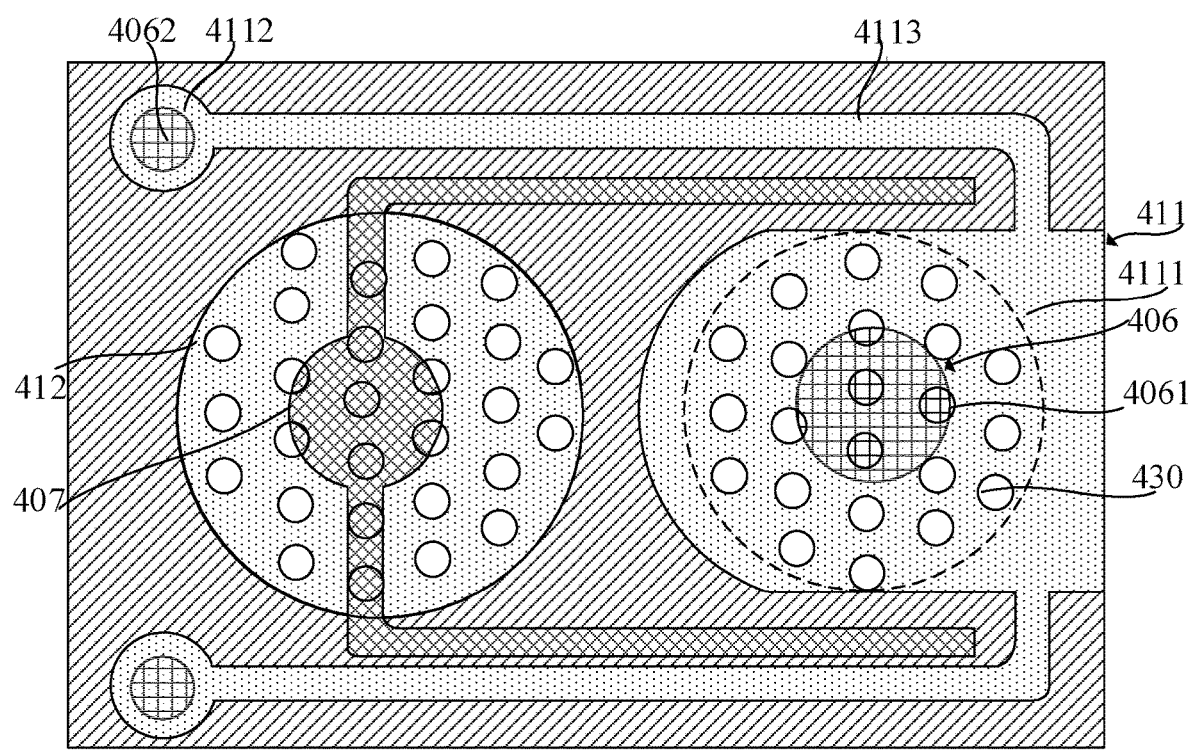
FIG. 13 is a top view illustrating an LED chip according to another exemplary embodiment of the present disclosure.

Referring to FIG. 13, a top view of an LED chip according to another exemplary embodiment of the present disclosure is shown. The same points in this exemplary embodiment as the previous exemplary embodiment will not be described again. The difference is that a partial area of the first extension electrode in the LED chip of this exemplary embodiment is used to form a plurality of concave spots.

In this exemplary embodiment, the first contact electrode 406 includes a primary contact electrode 4061, and two auxiliary contact electrodes 4062 that are isolated from the primary contact electrode 4061. The primary contact electrode 4061 is an electrode having a large contact area and corresponding to the soldering position.

The primary contact electrode 4061 and the auxiliary contact electrode 4062 are isolated from each other and distributed at different positions of the LED chip, which can increase the current distribution in the LED chip and enhance the uniformity of the light emitted from the LED chip.

It should be noted that, in this exemplary embodiment, the number of the auxiliary contact electrodes 4062 is two. In other exemplary embodiments, the number of the auxiliary contact electrodes 4062 is at least one in order to increase the current distribution.

The first extension electrode 411 includes a primary extension electrode 4111 covering the primary contact electrode 4061, a secondary extension electrode 4112 covering the auxiliary contact electrode 4062, and a linear extension electrode 4113 connecting the primary extension electrode 4111 and the auxiliary extension electrode 4112. A circular area (shown by a broken line) of the primary extension electrode 4111 above the primary contact electrode 4061 is formed with a plurality of concave spots 430 for achieving soldering.

In the subsequent soldering process, the solder easily is likely to form a circular extension surface, and a circular area in which a plurality of concave spots 430 are formed in the first extension electrode 411 matches the shape of the circular extension surface.

The surfaces of the first contact electrode 406 and the second contact electrode 407 are flush with each other to constitute a forming surface (not shown). In this exemplary embodiment, the primary contact electrode 4061 is a circular contact electrode, and a projected area of the circular area on the forming surface is larger than a projected area of the circular contact electrode on the forming surface. That is, the circular area for soldering has a large projected area, which can increase the soldering area between the LED chip and the driving circuit, thereby increasing the soldering strength.

It should be noted that, in other exemplary embodiments, the circular area may also be equal to or slightly smaller than the projected area of the circular contact electrode.

In this exemplary embodiment, the projection of the circular area on the forming surface and the projection of the circular contact electrode on the forming surface constitute a structure with concentric circles. Thus, when the LED chip is soldered to the driving circuit, the solder is located at the center of the concentric circles. It can be ensured that there is a large area of contact between the driving circuit and the circular area of the first extension electrode 411, and between the circular area of the first extension electrode 411 and the circular contact electrode, thereby improving the welding strength.

It should be noted that, in other exemplary embodiments, the projection of the circular region and the circular contact electrode on the forming surface may also be in a structure with intersecting circles, inscribed circles or an inner circular.

As shown in FIG. 13, the second contact electrode 407 includes a circular primary contact electrode, and two linear extension electrodes connected to the circular primary contact electrode, which can increase the current distribution in the LED chip and enhance the uniformity of the light emitted from the LED chip.

In this exemplary embodiment, the second extension electrode 412 is a circular extension electrode covering the circular primary contact electrode, and the entire area of the circular extension electrode is used to form a plurality of concave spots 430. That is, in this exemplary embodiment, the second extension electrode 412 does not completely cover the second contact electrode 407.

Figure 14:
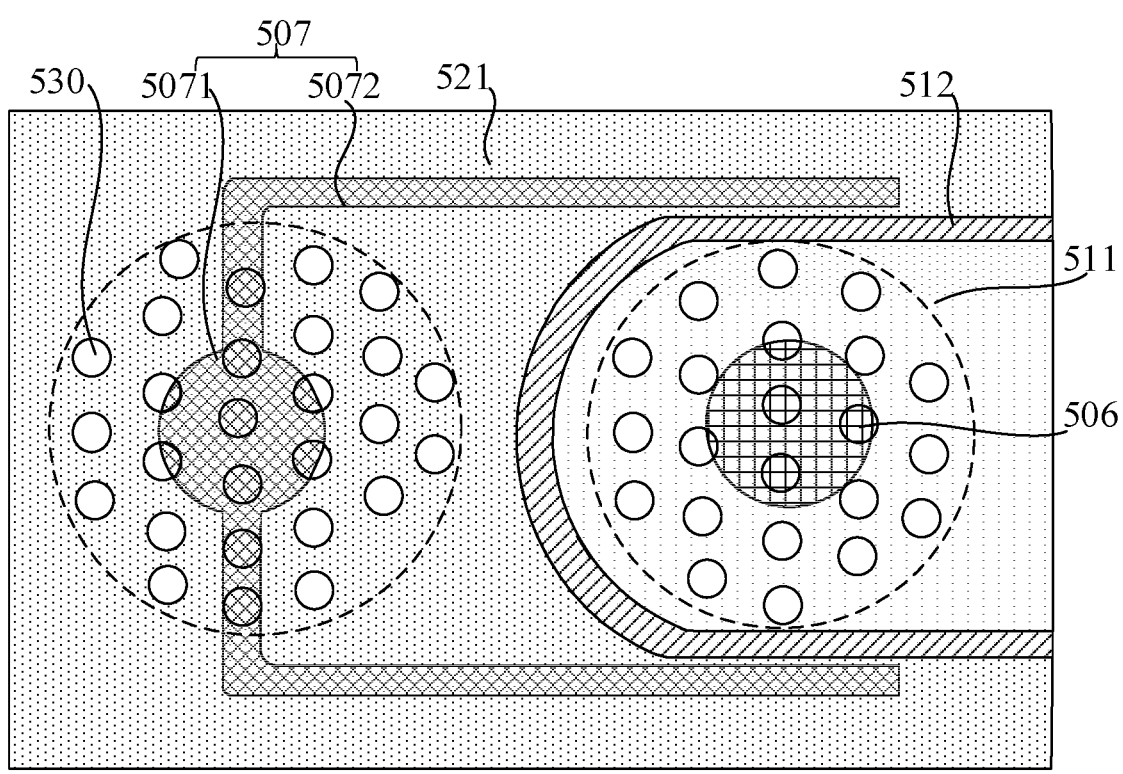
FIG. 14 is a top view illustrating an LED chip according to still another exemplary embodiment of the present disclosure.

Referring to FIG. 14, a schematic diagram illustrating an LED chip according to still another exemplary embodiment of the present disclosure is shown. The same points of the LED chip in this exemplary embodiment as the exemplary embodiments shown in FIG. 11 and FIG. 12 are not described again. The difference is that a partial area of the second extension electrode 521 in the LED chip of this exemplary embodiment is used to form the plurality of concave spots 530.

In this exemplary embodiment, the second contact electrode 507 includes a primary contact electrode 5071 and two extension electrodes 5072 connected to the primary contact electrode 5071, to increase the current distribution in the LED chip, thereby enhancing the uniformity of the light emitted from the LED chip.

It should be noted that in this exemplary embodiment, the number of the extension electrodes 5072 is two. In other exemplary embodiments, the number of the extension electrodes 5072 is at least one in order to increase the current distribution.

In this exemplary embodiment, the second extension electrode 521 covers the primary contact electrode 5071 and the elongated electrode 5072, and there is a large area of contact between the second extension electrode 521 and the second contact electrode 507, thereby improving the reliability of the electrical connection between the second extension electrode 521 and the second contact electrode 507. The circular area (an area around by a dashed line) of the second extension electrode 521 located above the primary contact electrode 5071 is formed with a plurality of concave spots 530 for soldering.

In the subsequent soldering process, the solder is likely to form a circular extension surface, and the circular area formed with the concave spots 530 in the second extension electrode 521 matches the shape of the circular extension surface.

In this exemplary embodiment, the primary contact electrode 5071 is a circular contact electrode, and a projected area of the circular area on the forming surface is larger than a projected area of the circular contact electrode on the forming surface. That is, the circular area for soldering has a large projected area, which can increase the soldering area between the LED chip and the driving circuit, thereby increasing the soldering strength.

It should be noted that, in other exemplary embodiments, the circular area may also be equal to or slightly smaller than the projected area of the circular contact electrode.

In this exemplary embodiment, the projection of the circular area and the circular contact electrode on the forming surface constitutes a structure with concentric circles. Thus, when the LED chip is soldered to the driving circuit, the solder is located at the center of the concentric circles. It can be ensured that there is a large area of contact between the driving circuit and the circular area of the second extension electrode 521, and between the circular area of the second extension electrode 521 and the circular contact electrode, thereby increasing the soldering strength.

It should be noted that, in other exemplary embodiments, the projection of the circular region and the circular contact electrode on the forming surface may also be in a structure with intersecting circles, inscribed circles or an inner circular.

As shown in FIG. 14, in this exemplary embodiment, the first contact electrode 506 is a circular primary contact electrode, the first extension electrode 511 covers the circular primary contact electrode, and a partial area (circular area) of the first extension electrode 511 is used to form the plurality of concave spots 530.

In this exemplary embodiment, the first extension electrode 511 is electrically insulated from the first extension electrode 521 by the second insulation layer 512.

Figure 15:
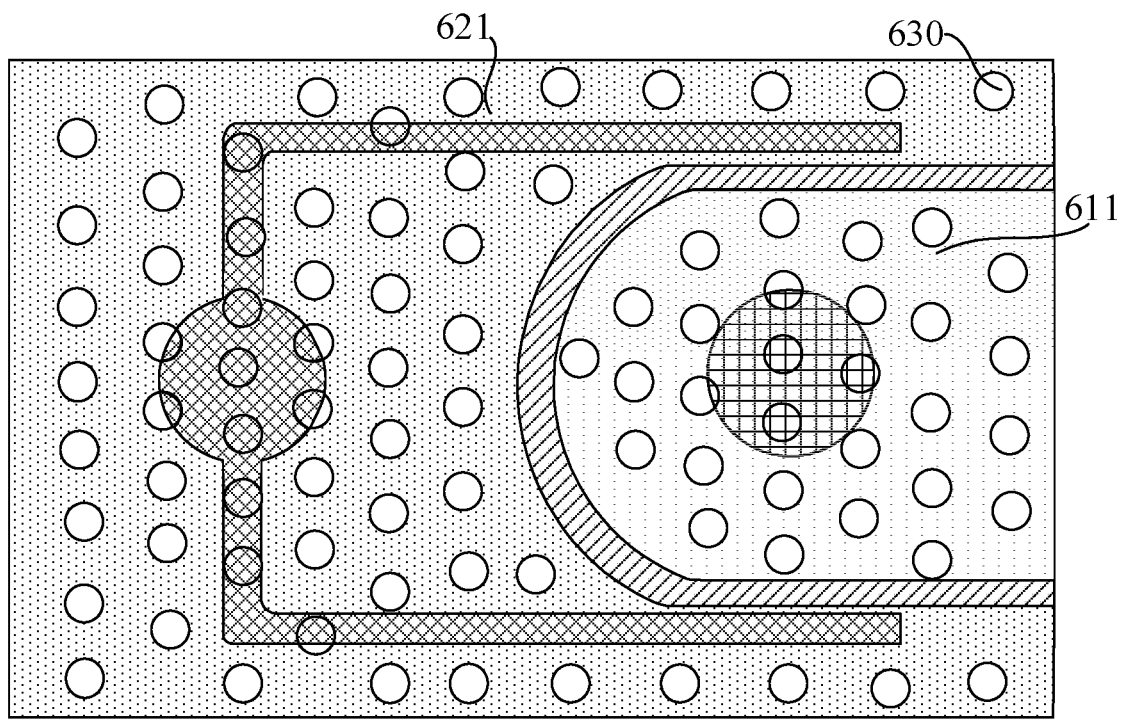
FIG. 15 is a top view illustrating an LED chip according to a further exemplary embodiment of the present disclosure.

It should be noted that, in this exemplary embodiment, a partial area (circular area) of each of the first extension electrode 511 and the second extension electrode 521 is formed with the concave spots 530 for soldering in. As shown in FIG. 15, in other exemplary embodiments, an entire area of each of the first extension electrode 611 and the second extension electrode 621 may be formed with concave spots 630 for soldering. During the soldering process, any region of the solder located at the first extension electrode 611 or the second extension electrode 621 may be formed in the concave spot 630, which reduces the difficulty in alignment of soldering positions, thereby enhancing the soldering strength.

Figure 16:
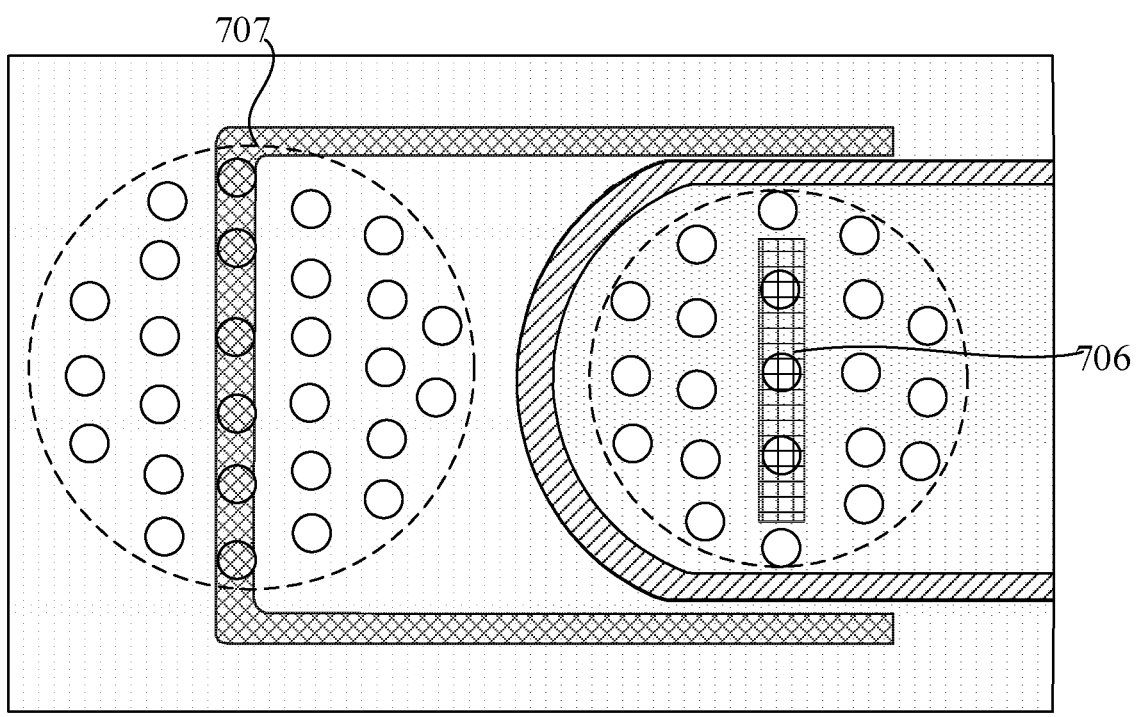
FIG. 16 is a top view illustrating an LED chip according to a further exemplary embodiment of the present disclosure.

It should be noted that, in the foregoing exemplary embodiments, the first contact electrode or the second contact electrode is a circular contact electrode, or the primary contact electrode of the first contact electrode or the second contact electrode is a circular contact electrode. In the LED chip according to the present disclosure, the first extension electrode or the second extended electrode is used for realizing the soldering contact. Therefore, the shape of the first contact electrode or the second contact electrode may be other shapes. For example, as shown in FIG. 16, the first contact electrode 706 or the second contact electrode 707 may be a strip electrode. The first contact electrode or the second contact electrode may also be a square electrode, an elliptical electrode, a trapezoidal electrode or the like.

Figure 17:
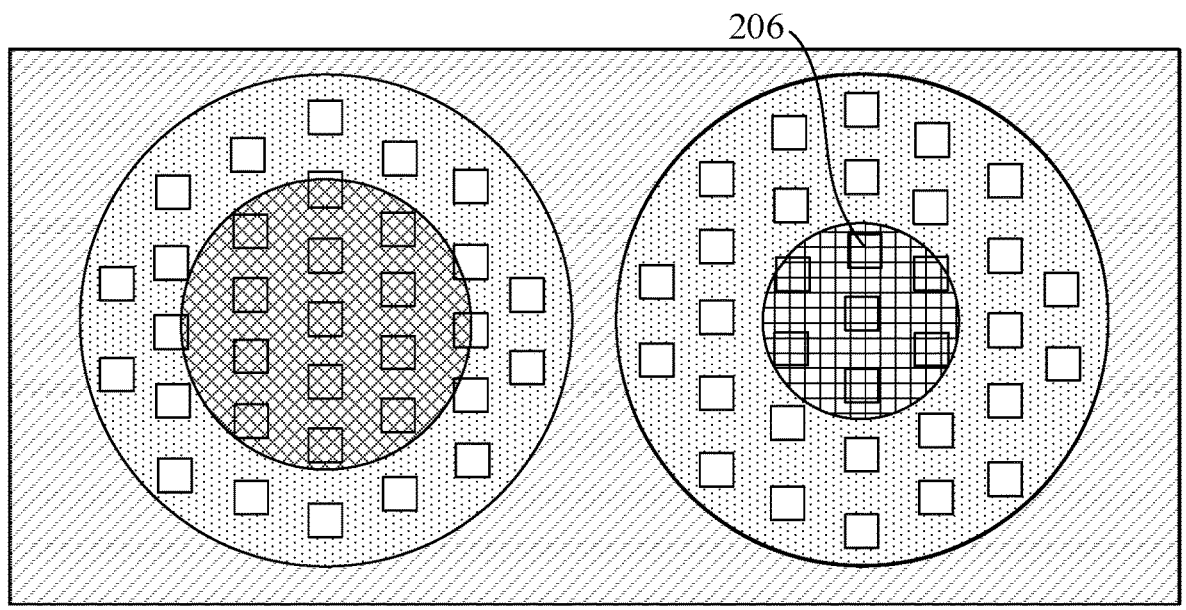
FIG. 17 is a top view illustrating an LED chip according to a further exemplary embodiment of the present disclosure.
Figure 18:
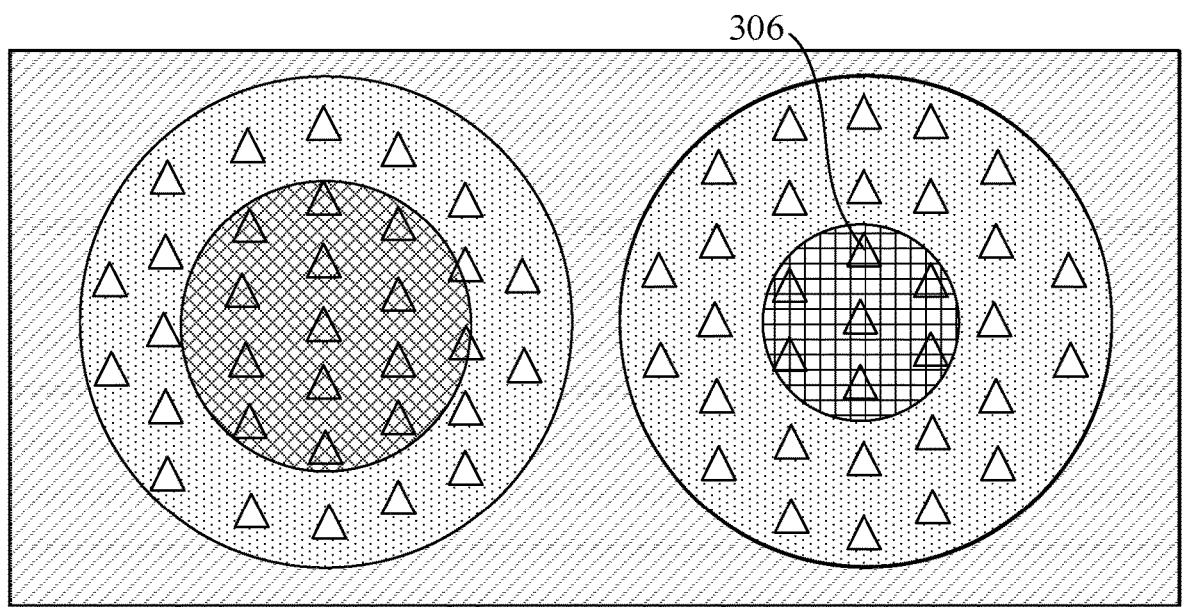
FIG. 18 is a top view illustrating an LED chip according to a further exemplary embodiment of the present disclosure.

It should also be noted that, in the foregoing exemplary embodiments, the shapes of the concave spots in the first extension electrode or the second extension electrode are all circular. The concave spots in the LED chip according to the present disclosure may be in other shapes. For example, as shown in FIG. 17, the concave spots 206 are square in shape; or, as shown in FIG. 18, the concave spots 306 are triangular in shape. The shape of the concave spot may also be a regular pentagon, a regular hexagon, or other regular polygons. Furthermore, the concave spots can also be irregular shaped concave spots.

It should be noted that the LED chip provided by the present disclosure may be formed by the method of manufacturing the LED chip provided by the present disclosure, or may be formed by other manufacturing methods.

Figure 19:
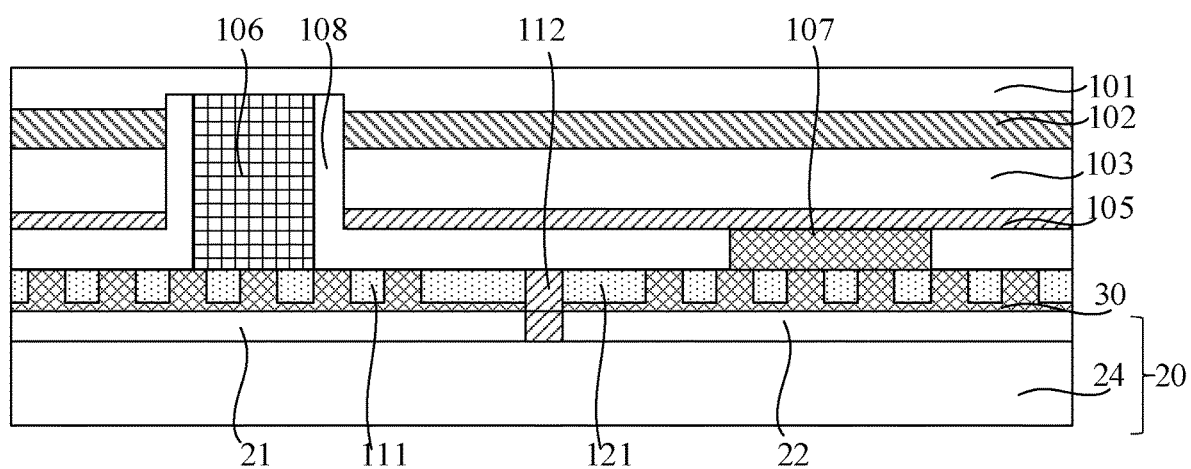
FIG. 19 is a cross-sectional diagram illustrating a display panel according to an exemplary embodiment of the present disclosure.

Accordingly, the present disclosure also provides a display panel, and with reference to FIG. 19, a schematic view illustrating a display panel according to an exemplary embodiment of the present disclosure is shown. The display panel includes:

a driving backboard 20 includes a substrate 24, and a plurality of circuit units (not shown) located on the substrate 24, the circuit units each including a first electrical terminal 21 and a second electrical terminal 22 used to apply a voltage to LED chip; and a plurality of LED chips inverted on the driving backboard 20, the first extension electrode 111 of the LED chip being soldered to the first electrical terminal 21 through the concave spots, and the second extension electrode of the LED chip 121 being soldered to the second electrical terminal 22 through the concave spot.

The LED chip is an LED chip provided by the present disclosure, and the related description is not repeated herein.

In this exemplary embodiment, the first extension electrode 111 is electrically connected to the first contact electrode 106, and the first contact electrode 106 is electrically connected to the first semiconductor layer 101. Therefore, the circuit unit applies a voltage to the first semiconductor layer 101 by the first electrical terminal 21. Correspondingly, the second extension electrode 121 is electrically connected to the second contact electrode 107, and the second contact electrode 107 is electrically connected to the second semiconductor layer 103. Therefore, the circuit applies a voltage to the second semiconductor layer 103 by the second electrical terminal 22. After the voltage is applied to the first semiconductor layer 101 and the second semiconductor layer 103, the active layer 102 emits light, and light is emitted from a side close to the first semiconductor layer 101.

In this exemplary embodiment, the first semiconductor layer 101 is an N-type semiconductor layer, and the second semiconductor layer 102 is a P-type semiconductor layer. Correspondingly, the first electrical terminal 21 is a negative connection terminal, and the second electrical terminal 22 is a positive connection terminal.

As shown in FIG. 19, the concave spots of the first extension electrode 111 in the LED chip are filled with solder 30 and soldered to the first electrical terminal 21. The concave spots of the second extension electrode 121 are filled with solder 30 and soldered to the second electrical terminal 22. The solder 30 is filled in the concave spots so that the soldering area is increased and the soldering strength is enhanced, thereby reducing the problem of the solder invalidation of the LED chip from the driving backboard 20, reducing the probability of occurrence of the dead pixel, and improving the yield of the display panel.

Specifically, the substrate 24 may be a rigid substrate, or may be a flexible substrate, a folded substrate, or a stretched substrate.

The present disclosure also provides an electronic device including the display panel provided by the present disclosure. The probability of occurrence of a dead pixel in the display panel is small, and accordingly, the electronic device has good reliability, long service life, and low repair rate.

The electronic device may be a mobile phone, a near-eye display device (VR or AR), a television, a wearable device, or the like.

Although the present disclosure has been disclosed above, the present disclosure is not limited thereto. Any changes and modifications may be made by those skilled in the art without departing from the spirit and scope of the application, and the scope of the application should be determined by the scope of the claims.

The invention claimed is:

1. A light-emitting diode (LED) chip comprising:
   a first semiconductor layer;
   an active layer and a second semiconductor layer located sequentially on the first semiconductor layer;
   a first contact electrode extending through the active layer and the second semiconductor layer and being electrically connected to the first semiconductor layer;
   a second contact electrode located on the second semiconductor layer and being electrically connected to the second semiconductor layer;
   a first extension electrode located on the first contact electrode and being electrically connected to the first contact electrode, the first extension electrode comprising a plurality of concave spots for soldering; and
   a second extension electrode located on the second contact electrode, being electrically connected to the second contact electrode and being isolated from the first extension electrode, and the second extension electrode comprising a plurality of concave spots for soldering,
   wherein the plurality of concave spots of the first extension electrode are formed through a thickness of the first extension electrode.

2. The LED chip according to claim 1, wherein at least a portion of the first extension electrode or the second extension electrode is used to form the plurality of concave spots.

3. The LED chip according to claim 2, wherein each of the first extension electrode and the second extension electrode is a circular extension electrode, and an entire area of the circular extension electrode is used to form the plurality of concave spots.

4. The LED chip according to claim 3, wherein:
   surfaces of the first contact electrode and the second contact electrode are flush with each other to constitute a forming surface;
   each of the first contact electrode and the second contact electrode is a circular contact electrode; and a projected area of the circular extension electrode on the forming surface is larger than a projected area of the circular contact electrode on the forming surface.

5. The LED chip according to claim 4, wherein a projection of the circular extension electrode on the forming surface and a projection of the circular contact electrode on the forming surface constitute a structure with concentric circles.

6. The LED chip according to claim 2, wherein a circular area in each of the first extension electrode and the second extension electrode is used to form the plurality of concave spots.

7. The LED chip according to claim 6, wherein:
the first contact electrode comprises a primary contact electrode, and at least one auxiliary contact electrode is isolated from the primary contact electrode;
the first extension electrode comprises a primary extension electrode covering the primary contact electrode, an auxiliary extension electrode covering the auxiliary contact electrode, and a linear extension electrode connecting the primary extension electrode with the auxiliary extension electrode; and
the plurality of concave spots are formed on a circular area of the primary extension electrode above the primary contact electrode.

8. The LED chip according to claim 6, wherein:
the second contact electrode comprises a primary contact electrode, and at least one extension electrode is connected to the primary contact electrode; and
the second extension electrode covers the primary contact electrode and the extension electrode, and a circular area of the second extension electrode above the primary contact electrode is used to form the plurality of concave spots.

9. The LED chip according to claim 7, wherein:
surfaces of the first contact electrode and the second contact electrode are flush with each other to constitute a forming surface;
the primary contact electrode is a circular contact electrode; and
a projected area of the circular area on the forming surface is greater than a projected area of the circular contact electrode on the forming surface.

10. The LED chip according to claim 8, wherein:
surfaces of the first contact electrode and the second contact electrode are flush with each other to constitute a forming surface;
the primary contact electrode is a circular contact electrode; and
a projected area of the circular area on the forming surface is greater than a projected area of the circular contact electrode on the forming surface.

11. The LED chip according to claim 9, wherein a projection of the circular area on the forming surface and a projection of the circular contact electrode on the forming surface form a structure with concentric circles, intersecting circles, inscribed circles or inner circulars.

12. The LED chip according to claim 10, wherein a projection of the circular area on the forming surface and a projection of the circular contact electrode on the forming surface form a structure with concentric circles, intersecting circles, inscribed circles or inner circulars.

13. The LED chip according to claim 1, wherein the LED chip further comprises a first insulating layer located between the first contact electrode and the second contact electrode, and flush with surfaces of the first contact electrode and the second contact electrode.

14. The LED chip according to claim 1, further comprising a second insulating layer located between the first extension electrode and the second extension electrode for realizing the isolation between the first extension electrode and the second extension electrode, a thickness of the second insulation layer being greater than a thickness of the first extension electrode or the second extension electrode.

15. The LED chip according to claim 1, wherein the first extension electrode or the second extension electrode is an elliptical extension electrode, a racetrack-shaped extension electrode or a polygonal extension electrode.

16. A method of manufacturing an LED chip, the method comprising:
providing a substrate;
forming a first semiconductor layer, an active layer, and a second semiconductor layer sequentially on the substrate;
forming a first contact electrode extending through the active layer and the second semiconductor layer and electrically connected to the first semiconductor layer;
forming a second contact electrode electrically connected to the second semiconductor layer on the second semiconductor layer;
forming a first extension electrode electrically connected to the first contact electrode on the first contact electrode, the first extension electrode comprising a plurality of concave spots for soldering; and
forming a second extension electrode electrically connected to the second contact electrode and isolated from the first extension electrode on the second contact electrode, the second extension electrode comprising a plurality of concave spots for soldering,
wherein the plurality of concave spots of the first extension electrode are formed through a thickness of the first extension electrode.

17. A display panel, comprising:
a driving backboard, comprising a substrate with a plurality of circuit units located thereon, the circuit units each comprising a first electrical terminal and a second electrical terminal; and
a plurality of LED chips inverted on the driving backboard, wherein each of the LED chips is the LED chip according to claim 1, the first extension electrode of the LED chip is soldered to the first electrical terminal through the concave spots, and the second extension electrode of the LED chip is soldered to the second electrical terminal through the concave spots.

18. The method according to claim 16, wherein:
surfaces of the first contact electrode and the second contact electrode are flush with each other to constitute a forming surface; and
the forming the first extension electrode and the second extension electrode comprises:
covering the forming surface with nanoimprint lithography resist;
patterning the nanoimprint lithography resist by means of nanoimprint technology to form a nanoimprint pattern layer;
forming a first conductive layer on the nanoimprint pattern layer and the forming surface among the nanoimprint pattern layer;
removing the first conductive layer on the nanoimprint pattern layer, and remaining the first conductive layer on the forming surface, to constitute the first extension electrode and the second extension electrode; and
removing the nanoimprint pattern layer.

19. The method according to claim 16, wherein the forming the first contact electrode and the second contact electrode comprises:
- forming a first opening extending through the active layer and the second semiconductor layer and exposing the first semiconductor layer;
- covering a first insulating material layer on a bottom and a sidewall of the first opening, and the second semiconductor layer;
- patterning the first insulating material layer to expose the bottom of the first opening, and forming a second opening on the second semiconductor layer;
- filling the first opening and the second opening with a second conductive layer; and
- planarizing the second conductive layer and the first insulating material layer, the second conductive layer located in the first opening being used to constitute the first contact electrode, and the second conductive layer located in the second opening being used to constitute the second contact electrode.

20. The method according to claim 16, further comprising: forming a second insulating layer between the first extension electrode and the second extension electrode, a thickness of the second insulation layer being greater than a thickness of the first extension electrode or the second extension electrode,
- wherein the forming the second insulation layer comprises:
- covering a second insulating material layer on the first extension electrode, the second extension electrode, and the forming surface; and
- patterning the second insulating material layer by a photolithography process to form the second insulating layer.

* * * * *